(12) United States Patent
Ettinger et al.

(10) Patent No.: US 6,361,422 B1
(45) Date of Patent: Mar. 26, 2002

(54) METHOD AND APPARATUS FOR TRANSFERRING SEMICONDUCTOR SUBSTRATES USING AN INPUT MODULE

(75) Inventors: Gary Ettinger, Los Altos; Greg Wiese, Campbell; Arulkumar Shanmugasundrum, Mountainview, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/547,189

(22) Filed: Apr. 11, 2000

Related U.S. Application Data

(60) Provisional application No. 60/139,222, filed on Jun. 15, 1999.

(51) Int. Cl.[7] ............................................. B24B 47/02
(52) U.S. Cl. ....................... 451/339; 451/287; 451/288
(58) Field of Search ................................. 451/339, 285, 451/286, 287, 288, 289, 41

(56) References Cited

U.S. PATENT DOCUMENTS

| | | | | |
|---|---|---|---|---|
| 5,498,199 A | * | 3/1996 | Karlsrud et al. | 451/289 |
| 5,618,227 A | * | 4/1997 | Tsutsumi et al. | 451/288 |
| 5,655,954 A | * | 8/1997 | Oishi et al. | 451/288 |
| 5,679,055 A | * | 10/1997 | Greene et al. | 451/288 |
| 5,679,060 A | * | 10/1997 | Leonard et al. | 451/285 |
| 5,738,574 A | * | 4/1998 | Tolles et al. | 451/288 |
| 5,934,984 A | | 8/1999 | Togawa et al. | 451/288 |
| 5,957,764 A | * | 9/1999 | Anderson et al. | 451/288 |
| 5,961,380 A | * | 10/1999 | Togawa et al. | 451/339 |
| 6,036,582 A | | 3/2000 | Aizawa et al. | 451/41 |
| 6,165,050 A | * | 12/2000 | Ban et al. | 451/288 |

* cited by examiner

Primary Examiner—Derris H. Banks
Assistant Examiner—Hadi Shakeri
(74) Attorney, Agent, or Firm—Moser, Patterson & Sheridan

(57) ABSTRACT

A semiconductor substrate processing method and apparatus, more specifically, a method and apparatus for polishing a substrate or semiconductor wafer in a polishing system. In one embodiment, the system includes one or more polishing modules, an input module, a first robot and a second robot that provides a compact polishing system that has a minimal tool footprint. The first robot is adapted to transfer the substrate to the input module, while the second robot is adapted to transfer the substrate between the input module and the one or more polishing modules. In another embodiment, the first and second robots have rotary actuators coupled to their grippers that enable the substrate to be orientated between a horizontal and vertical position. The input module is adapted to maintain the substrate in a vertical orientation. The vertical orientation of the substrates facilitates integration of a cleaning system that cleans the substrates while in the vertical orientation.

33 Claims, 9 Drawing Sheets

METHOD AND APPARATUS FOR TRANSFERRING SEMICONDUCTOR SUBSTRATES USING AN INPUT MODULE

This application claims benefit of U.S. Provisional Application No. 60/139,222, filed Jun. 15, 1999, which is hereby incorporated by reference in its entirety.

BACKGROUND OF THE DISCLOSURE

1. Field of Invention

The present invention relates generally to a semiconductor substrate processing system. More specifically, the invention relates to a method and apparatus for polishing a semiconductor substrate.

2. Description of the Background Art

In semiconductor substrate processing, the transfer of substrates between modules is required to optimize processing rates while minimizing risk of substrate damage and contamination. The typical method of transferring a substrate between processing and support equipment is to move the substrate using a paddle manipulated by a robot. In most instances, the substrate is lifted from a pedestal using pins to allow the paddle to be positioned under the center portion of the substrate. In other modules, such as transfer cassettes, the substrate is supported horizontally at the edges, allowing the paddle access under the substrate. The paddle is then lifted to engage the substrate and carry the substrate from one module or station to another. Often, the paddle is equipped with a mechanism that secures the substrate to the paddle during transfer and releases the substrate once the desired destination is reached. Such a mechanism may be a vacuum device, an electrostatic chuck, a substrate edge gripping mechanism and the like.

The traditional, horizontal paddle and retention mechanisms, while functional for passing substrates among certain semiconductor processing stages, are cumbersome when directed for use between certain types of semiconductor processing stages. The transfer between a factory interface and a polisher on Chemical Mechanical Polishing (CMP) system is an example of an area where the horizontal orientation of the substrate during transfer is not efficient.

The polisher generally removes the surface roughness of a substrate orientated horizontally with the assistance of a slurry. After polishing the substrate, some of the slurry remains on the substrate. If the slurry dries and hardens on the substrate surface, the substrate may become damaged, defective or unfit for further processing. Therefore, the polished substrates are normally cleaned by spraying the substrates with a cleaning fluid, scrubbing the substrates, and by using megasonics. The substrates can be cleaned either in a horizontal or vertical position. Those substrates cleaned vertically benefit from the assistance of gravity in removing the slurry and other contaminants from the substrate.

The 90 degrees difference in substrate orientation between the polishing and cleaning processes leads to a number of problems for a system builder and operator when using a traditional horizontally orientated substrate transfer mechanism. One problem is that a larger machine foot-print is required to accommodate rinsing a substrate while the substrate is horizontal, added stations for orientating the substrates and/or increased transfer distances. Additionally, the extra steps in substrate handling increases the probability of costly substrate damage and contamination.

Therefore, there is a need in the art for apparatus which facilitates substrate transfer between modules of a semiconductor processing system, wherein vertical orientation of the substrate is used during substrate transfer.

SUMMARY OF INVENTION

The disadvantages associated with the prior art are overcome by the present invention of a semiconductor substrate polishing method and system. More specifically, the substrate polishing system includes an input module and one or more polishing modules that have a transfer station. A first robot is disposed proximate the input module. The first robot has a first gripper that is rotatable on a first horizontal axis and is adapted to selectively pick and place the substrate vertically in the input module. A second robot is disposed proximate the input module and the polishing modules. The second robot has a second gripper that is rotatable on a second horizontal axis and is adapted to selectively pick and place the substrate vertically in the input module.

In another embodiment, the semiconductor substrate polishing system includes one or more chemical mechanical polishing modules, a factory interface module and a cleaning module having an input module at a first end. The cleaning module is disposed between the factory interface module and the one or more chemical mechanical polishing modules. A first robot has a first gripper that is disposed in the factory interface module and adapted to transfer substrates between the factory interface module, the input module and a second end of the cleaning module. A second robot is disposed proximate the input module and one or more polishing modules. The second robot has a second gripper that is adapted to transfer substrates between the input module, the first end of the cleaner and the one or more chemical mechanical polishing modules.

In another aspect, a method for transferring a semiconductor substrate is disclosed comprising the steps of providing the horizontally orientated semiconductor substrate at a first location; gripping the horizontally orientated semiconductor substrate with a first robot; moving the semiconductor substrate while changing the orientation of the semiconductor substrate from horizontal to vertical; releasing the vertical semiconductor substrate from the first robot into an input module, the input module maintaining the vertical orientation of the semiconductor substrate; gripping the vertical semiconductor substrate with a second robot; moving the semiconductor substrate while changing the orientation of the semiconductor substrate from vertical to horizontal; placing the horizontal semiconductor substrate at a second location and releasing the semiconductor substrate from the second robot.

BRIEF DESCRIPTION OF DRAWINGS

The teachings of the present invention can be readily understood by considering the following detailed description in conjunction with the accompanying drawings, in which:

FIG. 7A is a perspective schematic of the pass through;

To facilitate understanding, identical reference numerals have been used, where possible, to designate identical elements that are common to the figures.

DETAIL DESCRIPTION OF INVENTION

Figure 1:
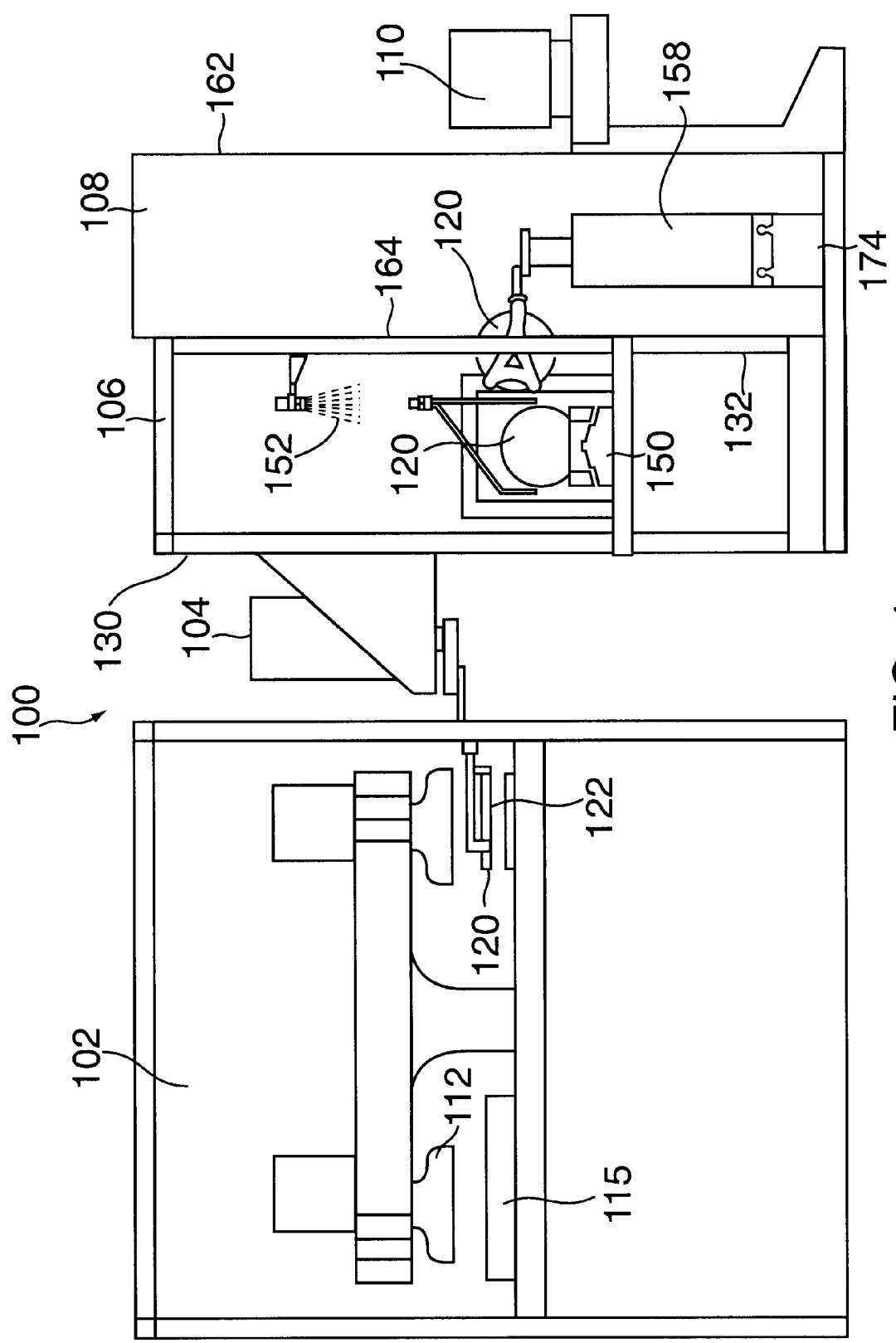
FIG. 1 is a schematic of a CMP substrate processing system.
Figure 2:
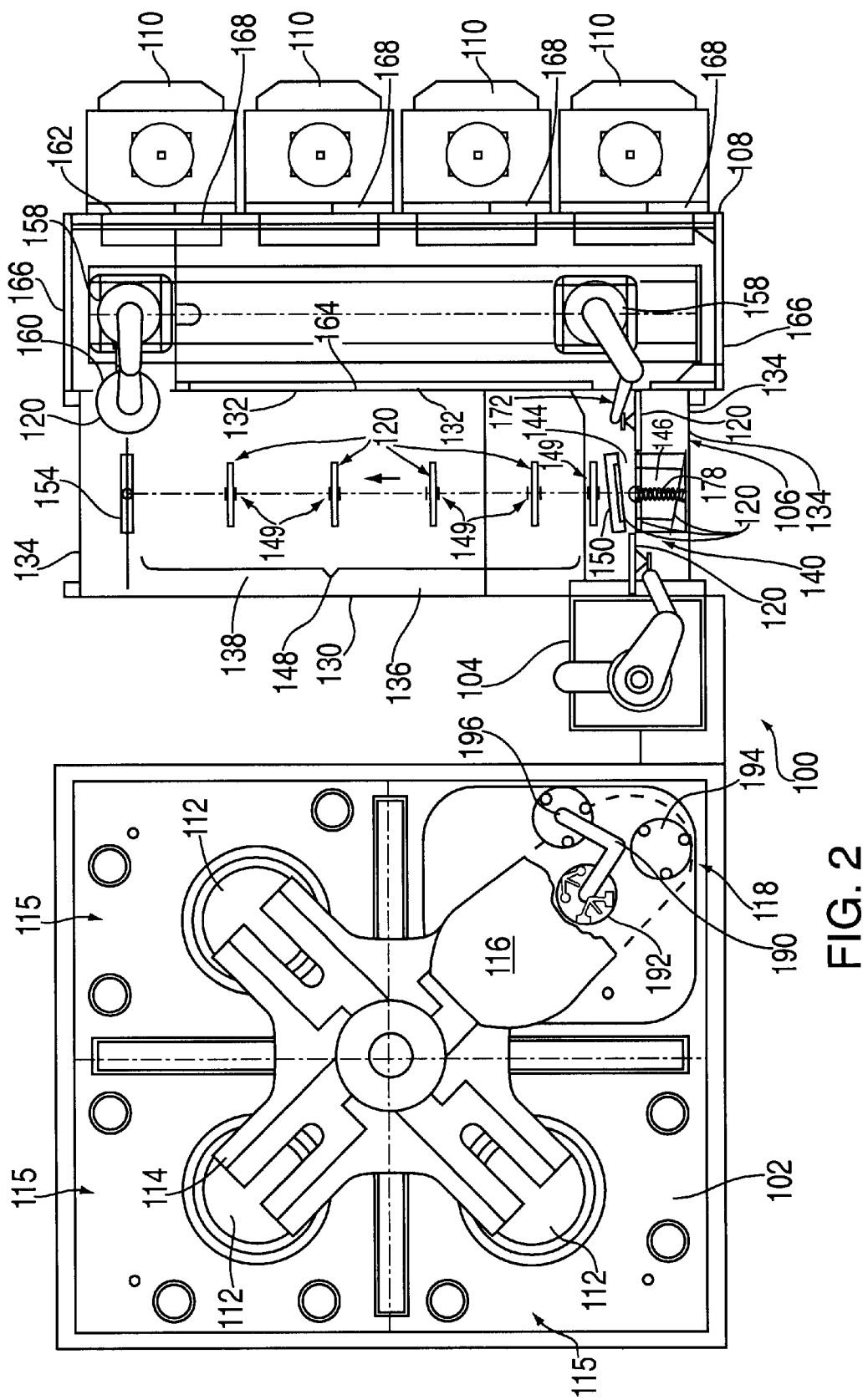
FIG. 2 is a top view of the CMP substrate processing system of FIG. 1.

FIGS. 1 and 2 depict an exemplary semiconductor wafer chemical mechanical polishing system (CMP system) 100. The reader is encouraged to simultaneously refer to both FIGS. 1 and 2 to achieve the greatest understanding of the invention. The CMP system 100 is generally comprised of modules, including, for example, one or more polishing modules 102, a first or wet robot 104, a cleaning module 106, a factory interface module 108, and one or more wafer storage cassettes 110 (four cassette 110 are shown). Alternatively, other polishing systems having varied configurations may be devised by one skilled in the art that include fewer or additional modules.

The factory interface module 108 is generally substantially rectangular in shape having a first wall 162, a second wall 164 and lateral walls 166. The first wall 162 includes a plurality of bays 168 adapted to interface with at least one of the wafer cassettes 110. The second wall 164 mates against a back wall 132 of the cleaning module 106 and shares a first port 160 and a second port 172 with the back wall 132. It should be noted that it may be desirable to combine the second wall 164 and the back wall 132 into one structure, or eliminate both walls 132 and 164, effectively creating one continuous port (i.e., combining ports 160 and 172).

Disposed within the factory interface module 108 is a railway 174. The railway 174 extends along and is orientated substantially parallel to the first wall 162. The railway 174 generally supports a second or factory interface robot 158. The railway 174 permits the factory interface robot 158 to travel linearly along the railway 174 such that the factory interface robot 158 may transfer wafers through the port 160, 172 and bays 168. Alternatively, the railway 174 may be eliminated in configurations where the factory interface robot 158 can access the ports 160, 172 and bays 168 without need of the railway 174. The factory interface robot 158 is driven along the railway 174 by an actuator not shown, however, the railway 174 and actuator may be replaced by any other positionable linear motion devices such as linear actuators, ball screws, hydraulic and pneumatic cylinders, stepper and servo motors, and the like.

Figure 3:
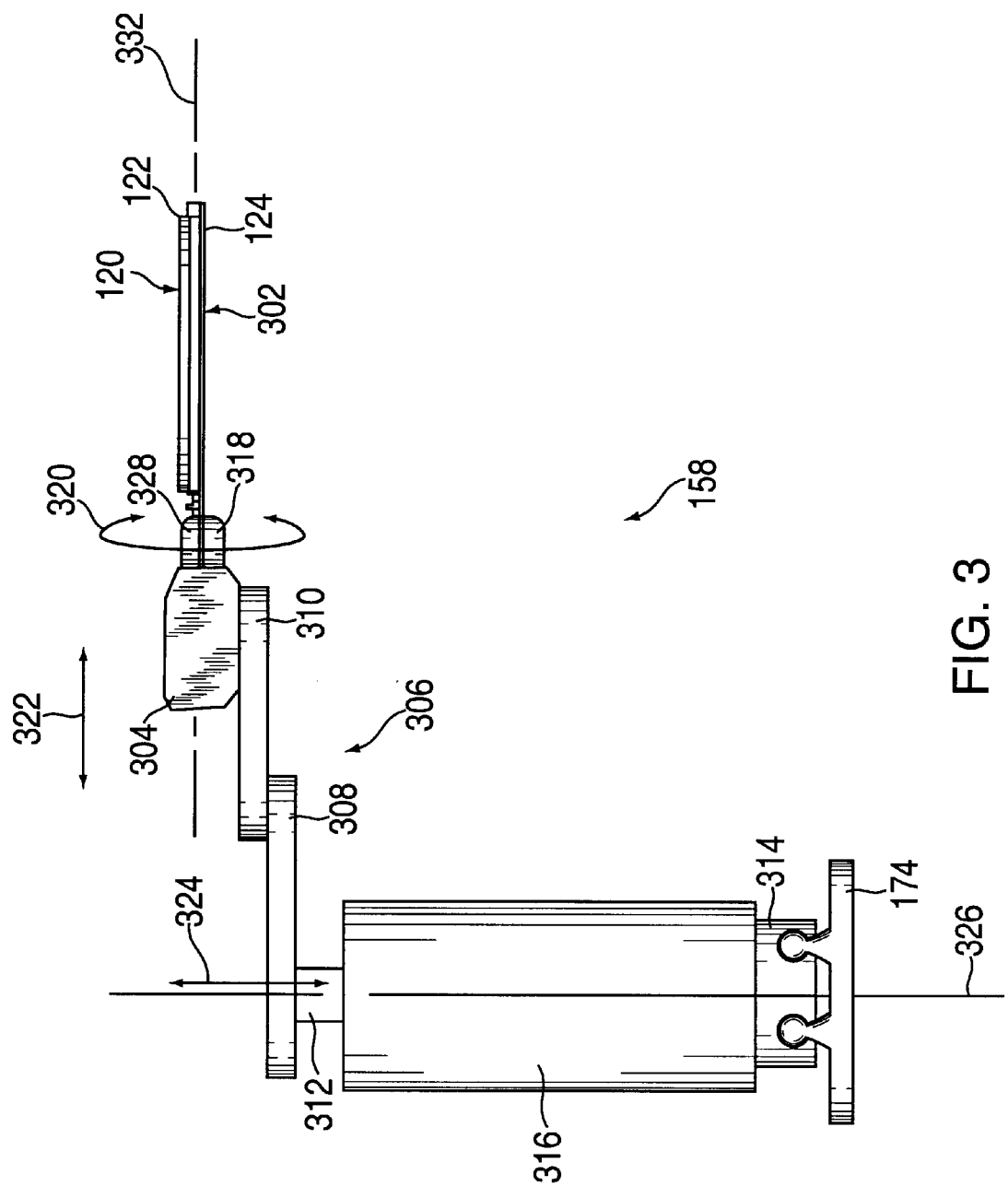
FIG. 3 is a schematic of the wet robot of the present invention.

FIG. 3 depicts the factory interface robot 158 that is housed within the factory interface module 108. The factory interface robot 158 generally provides the range of motion required transfer wafers between the cassettes 110 and other modules of the system 100. An example of a factory interface robot 158 is a 4-Link robot, manufactured by Kensington Laboratories, Inc., Richmond, Calif.

The exemplary factory interface robot 158 has a robot base 316, a shaft 312, an articulated arm 306, a rotary actuator 304 and an edge contact gripper 302. The robot base 316 is connected to a guide 314. The guide 314 connects the robot base 316 to the railway 174 that permits the factory interface robot 158 to travel linearly. The shaft 312 protrudes from the robot base 316. The shaft 312 is capable of extending and retracting from the robot base 316 as depicted by the arrows 324.

The articulated arm 306 is comprised of a first and a second member, 308 and 310, respectively. The first member 308 is connected to the shaft 312 at one end and to the second member 310 at the other. The second member 310 is also connected to the rotary actuator 304. The articulated arm 306 provides radial motion of 335 degrees about a centerline 326 of the factory interface robot 158 as shown by arrows 322.

The rotary actuator 304 is coupled to a proximate end of a shaft 318 and provides rotary motion about a horizontal axis 332 to the shaft 318 as illustrated by arrows 320. The edge contact gripper 302 is disposed at a distal end 328 of the shaft 318. The edge contact gripper 302 holds the perimeter of the wafer 120 securely during transfer by the factory interface robot 158.

Figure 4:
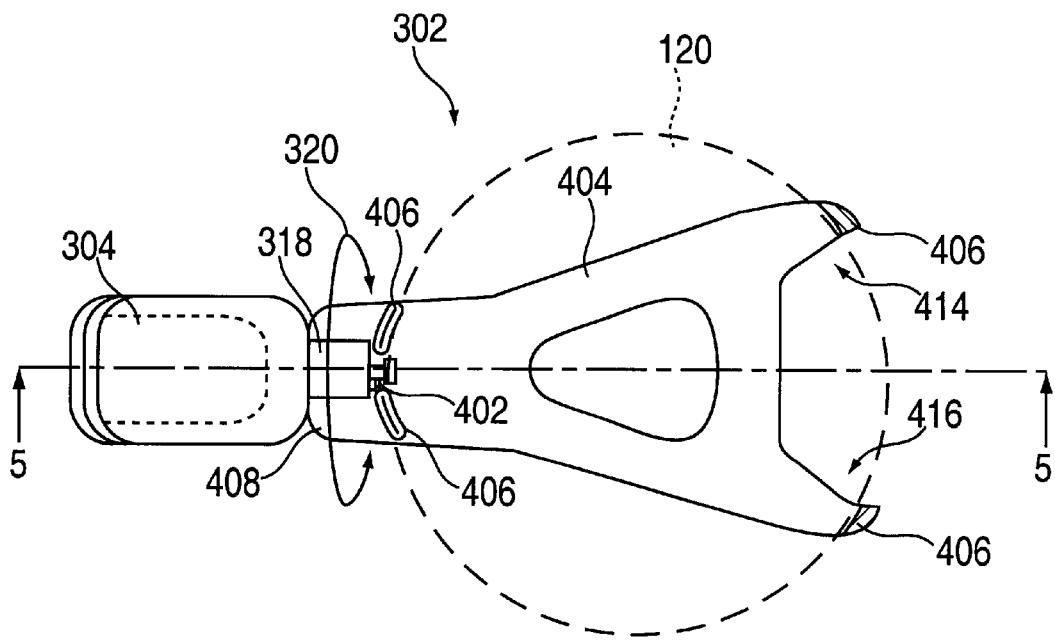
FIG. 4 is a plan view of a gripper of the wet robot of FIG. 3.
Figure 5:
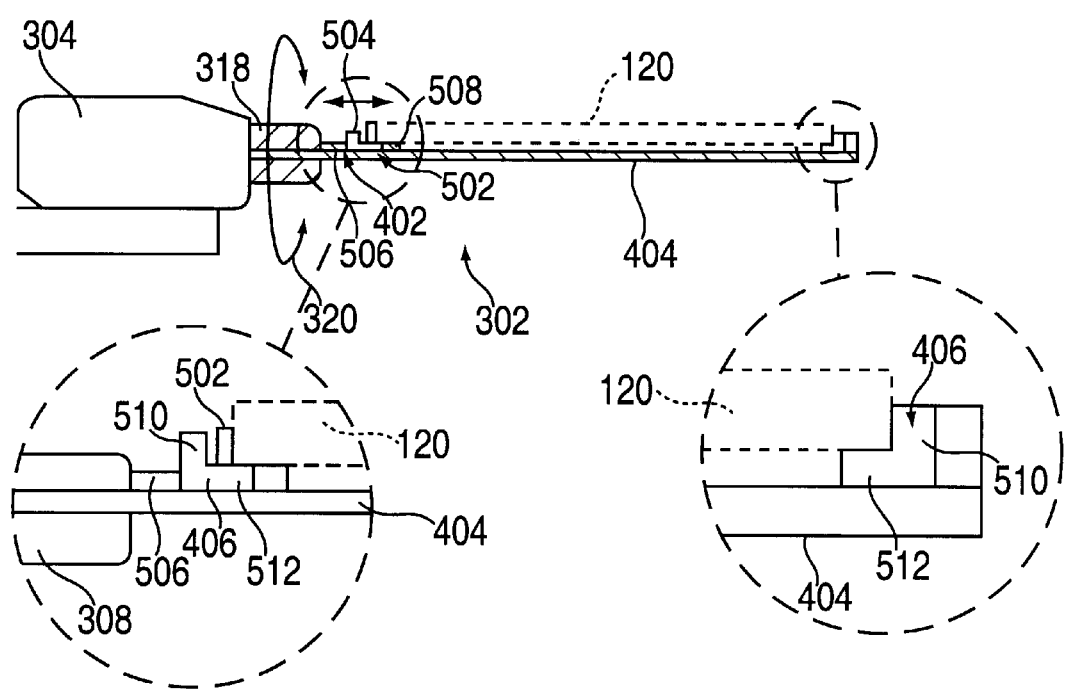
FIG. 5 is cross sectional view of the gripper of FIG. 4 taken along section line 5—5.

FIG. 4 depicts a top plan view of the edge contact gripper 302 of the factory interface robot 158 of FIG. 3. FIG. 5 depicts a cross sectional view of the edge contact gripper 302 of FIG. 4 taken along section line 5—5. The reader is encouraged to simultaneously refer to FIGS. 4 and 5 for the best understanding to the edge contact gripper 302.

The edge contact gripper 302 generally comprises an actuator 402 disposed on a paddle 404. The paddle 404 is typically a flat, "Y" shaped member comprised of aluminum. A first end 408 of the paddle 404 is coupled to the shaft 318. A second end 414 and a third end 416 of the paddle 404 are spaced apart from each other and positioned generally opposite the first end 408.

The actuator 402 is disposed on the first end 408 of the paddle 404. The actuator 402 has an "L" shaped pusher 502 generally fabricated from a non-abrasive material such as a polymer. The pusher 502 has a first portion 504 that is orientated substantially perpendicular to the paddle 404. The first portion 504 is coupled to a shaft 506 of the actuator 402. A second portion 508 extends perpendicularly from the first portion 504 towards the center of the paddle 404.

A plurality of seats 406 are disposed on the paddle 404. The seats 406 are generally fabricated from a non-abrasive material such as a polymer. Two seats 406 are disposed on the first end 408 of the paddle 404, positioned to either side of the actuator 402. A seat 406 is also disposed on the second end 414 and third end 416. Each seat 406 is generally a section of a ring, having an "L" shaped cross section. Each seat 406 has a first portion 510 orientated substantially perpendicular to the paddle 404. The first portion 510 has a radius approximately half the diameter of the wafer 120 for which the gripper 302 is configured (i.e., 100 mm, 200 mm, 300 mm or other diameter wafers). A second portion 512 extends perpendicularly from the first portion 510 towards the center of the paddle 404. The seats 406 are positioned such that a wafer 120 may be disposed on the second portion 512 of the seats 406 with some clearance between the wafer 120 and the first portion 510.

The wafer 120 is retained on the gripper 302 by actuating the pusher 502 to move towards the center of the paddle 404. The first portion 504 of the pusher 502 contacts the edge of the wafer 120 and forces the wafer 120 against the seats 406 disposed on the second and third ends 414, 416.

The edge contact gripper 302 permits the factory interface robot 158 to hold the wafer without contacting the feature side 122 of the wafer 120 and possibly causing scratching or damage to the exposed features. Additionally, the edge contact gripper 302 securely holds the wafer 120 during wafer transfer thus decreasing the probability of the wafer coming disengaged. Optionally, other types of grippers, such as electrostatic grippers, vacuum grippers and mechanical clamps, may be substituted.

Figure 6:
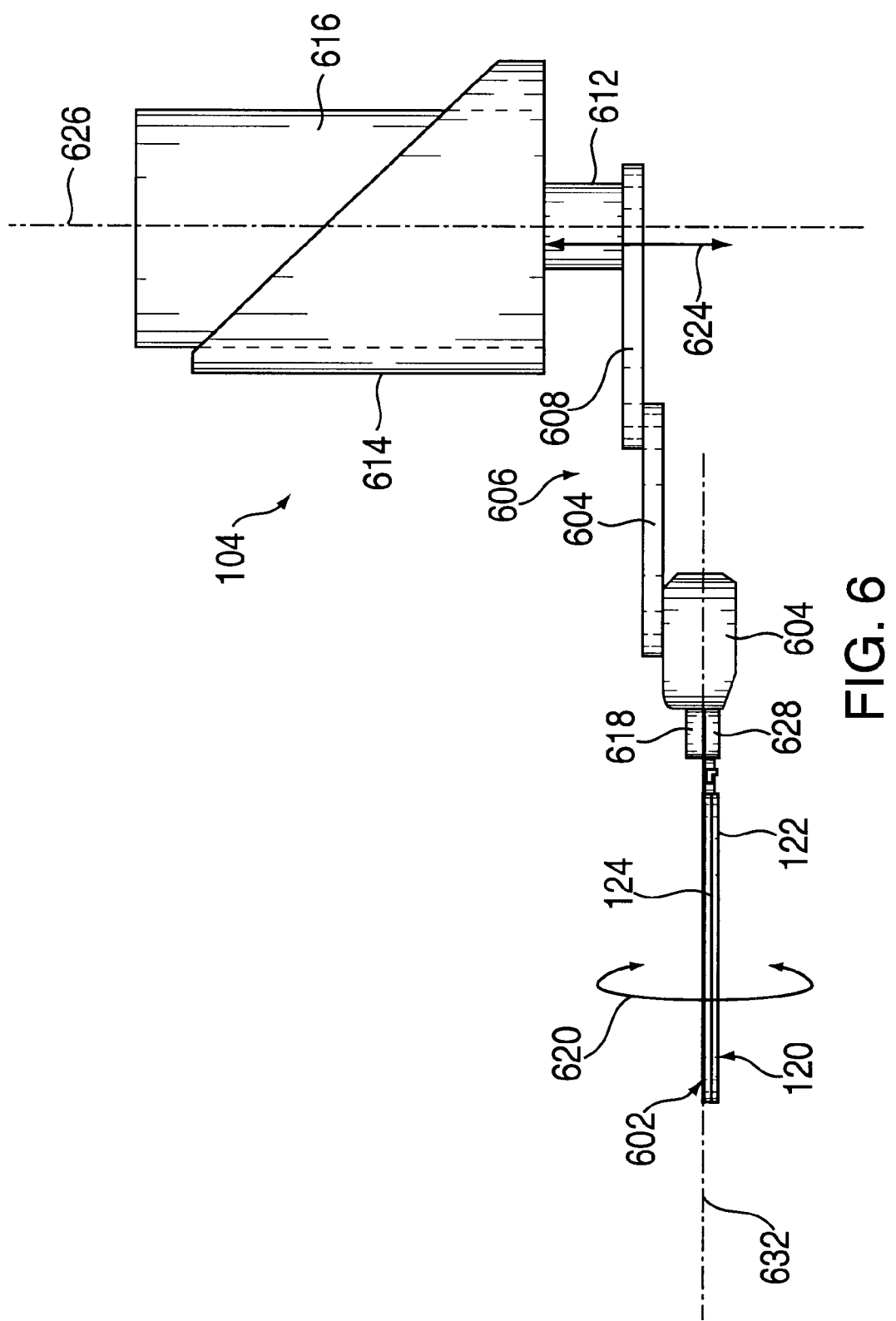
FIG. 6 is a schematic of the factory interface robot of the present invention.

FIG. 6 depicts the wet robot 104. The wet robot 104 is generally similar in configuration to the factory interface robot 158. The wet robot 104 generally includes a robot base 616, a shaft 612, an articulated arm 606, a rotary actuator 604 and an edge contact gripper 602. The robot base 616 is held by a mounting bracket 614 that is coupled to the cleaning 106. Alternatively, the mounting bracket may include a railway (not shown) as to permit the wet robot 104 to move laterally along the railway. The shaft 612 protrudes from the robot base 616 and passes through the mounting bracket 614. The shaft 612 is capable of extending and retracting from the robot base 616 as depicted by the arrows 624.

The articulated arm 606 is comprised of the first and a second member, 608 and 610, respectively. The first member 608 is connected to the shaft 612 at one end and to the second member 610 at the other. The second member 610 is also connected to the rotary actuator 604. The articulated arm 606 provides radial motion of 335 degrees about the centerline 626 of the wet robot 104 as shown by arrows 622.

The rotary actuator 604 provides rotary motion about a horizontal axis 632 to a shaft 618 as illustrated by arrows 620. The edge contact gripper 602 is disposed at a distal end 628 of the shaft 618. The edge contact gripper 602 is substantially similar in configuration to either the edge contact gripper 302 or edge contact gripper 600, and is used securely hold the wafer 120 during transfer by the wet robot 104.

Referring back to FIG. 1 and FIG. 2, the cleaning module 106 is also generally a rectangular shaped cabinet having a front wall 130, the back wall 132, and side walls 134 which define an interior 136. The interior 136 is divided into a cleaning system 138, a staging section 140 and an input module 144. The input module 144 separates the staging section 140 from the cleaning system 138, but also can encompass those portions of the staging section 140 and cleaning system 138 that are accessible by the wet robot 104 for picking and placing the substrate 120.

Substrates 120 in the input module 144 are orientated in a substantially vertical position. In the input module 144, the substrate 120 may be placed on either an indexable buffer 146, a walking beam 148 or placed on a substrate pass through 150. The indexable buffer 146, the walking beam 148 and the pass through 150 all hold the substrate 120 in a substantially vertical position. The substrates 120 to be polished are either placed in the pass through 150 for immediate transfer to the polishing module 102 or staged in the indexable buffer 146. The substrates 120 returning from the polishing module 102 are placed on the walking beam 148 by the robot 158.

The pass through 150 is positioned so that both the wet robot 104 and the factory interface robot 158 are able to pick and place the substrate 120 in the pass through 150. As such, the pass through 150 is used to pass a substrate from one robot to the other robot.

Figure 7A:
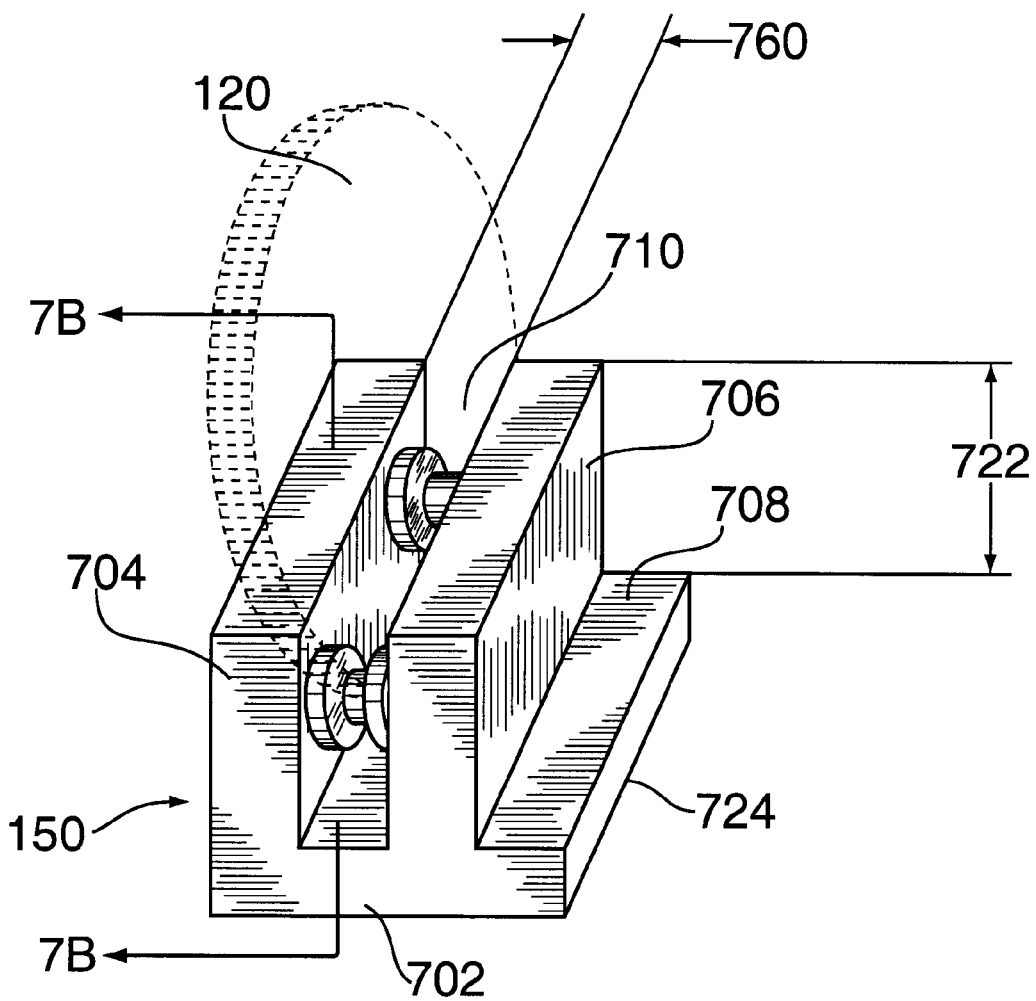
Figure 7B:
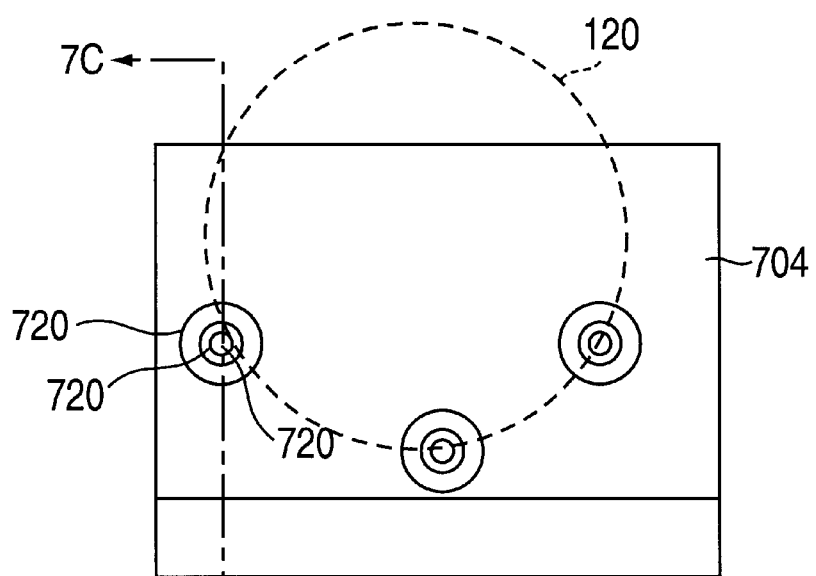
FIG. 7B is a cross sectional view of the pass through of FIG. 7A taken along section line 7B—7B.
Figure 7C:
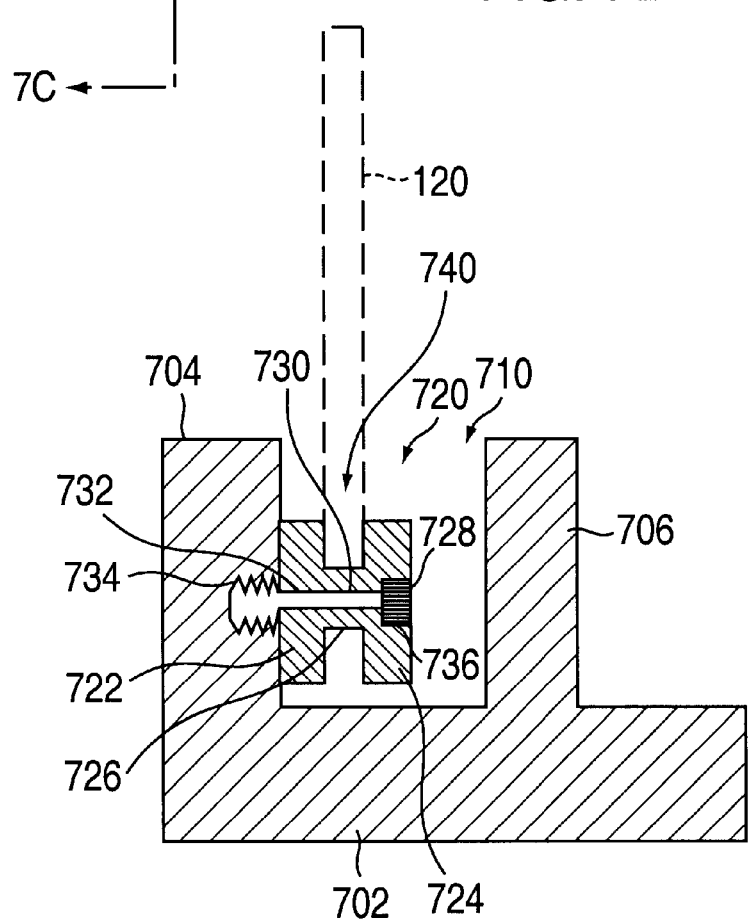
FIG. 7C is a cross sectional view of the pass through of FIG. 7B taken along section line 7C—7C.

FIGS. 7A–C depict the pass through 150. Referring to FIGS. 2 and 7A–C simultaneously, one embodiment of the pass through 150 has a rectangular base 702. A first wall 704 and a second wall 706 are substantially parallel and protrude from an upper surface 708 of the base 702 defining a slot 710. The first wall 704 and the second wall 706 are of a height 722 and are separated by a distance 760 which allows for the substrate 120 to be held substantially vertically in the slot 710. The upper surface 708 may be concave or have projections (not shown) that assist in maintaining the substrate 120 in an upright (vertical) position within the slot 710.

In one embodiment, the pass through 150 includes a plurality of wafer supports 720 (three are shown in FIG. 7B) coupled to the first wall 704. The supports 720 are typically fabricated out of plastic or other non-abrasive material. Each support 720 has a first portion 722, a second portion 724 and a third portion 726 that separates the first portion 722 and the second portion 724 and defines a slot 740 therebetween. The third portion 726 has a diameter that is less than the diameters of the first portion 722 and the second portion 724. A mounting hole 730 passes concentrically through the third portion 726. The mounting hole 730 generally includes a counter-bore 736 in the second portion 724 that accommodates a head 728 of a mounting screw 732 that is threaded into a threaded hole 734 in the first wall 704. The supports 720 are spaced apart from each other and at distance from the base 702 that allows for the wafer 120 to be set between the first portion 722 and the second portion 724 while resting on the third portion 726 of the supports 720 such that the wafer 120 is secured in the slot 740. The supports 720 may be in the form of a roller, or alternatively may be a fixed block of material having a slot 740 that retains the wafer in a vertical orientation within the pass through 150.

Figure 8:
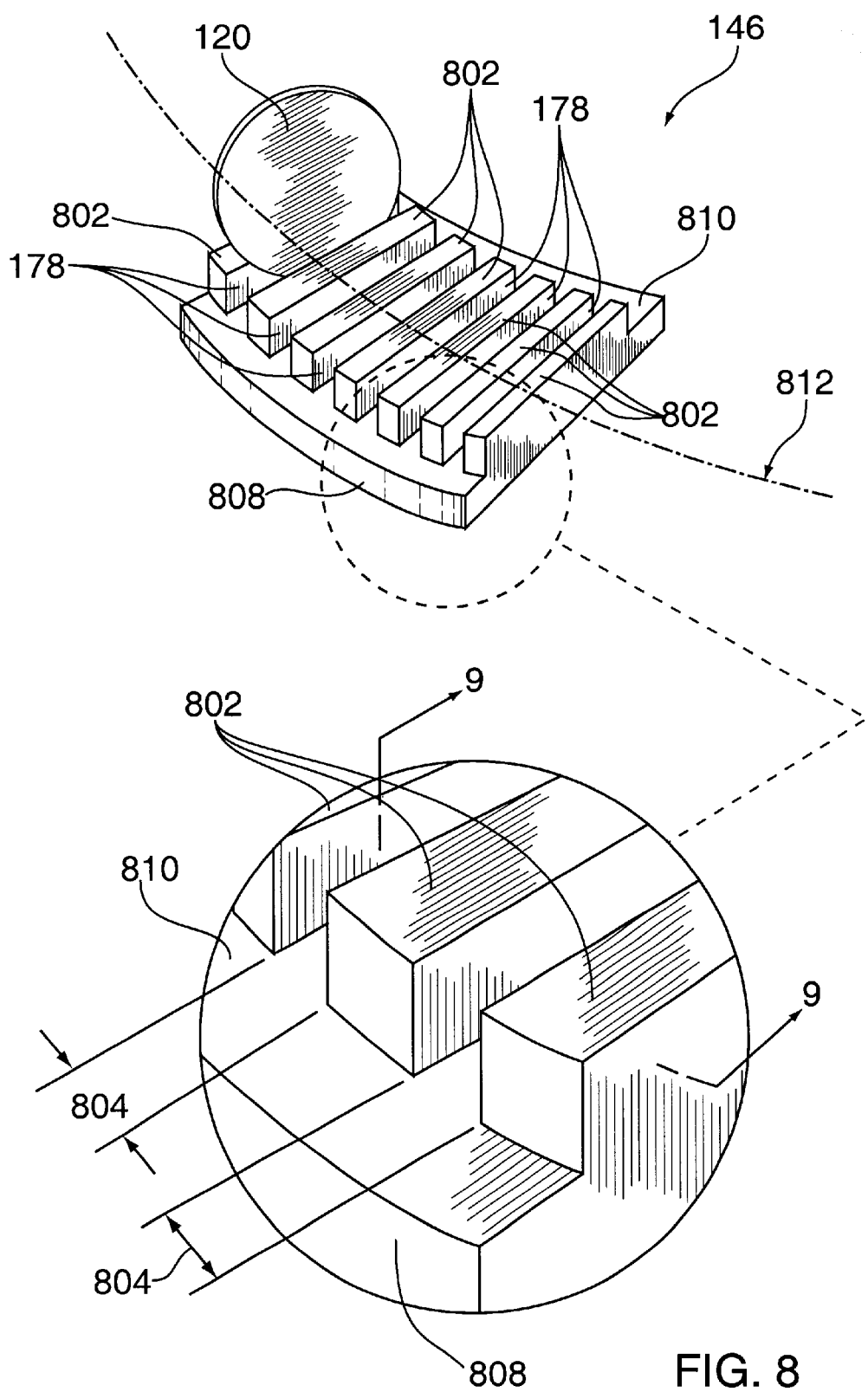
FIG. 8 is a perspective of the indexable buffer.
Figure 9:
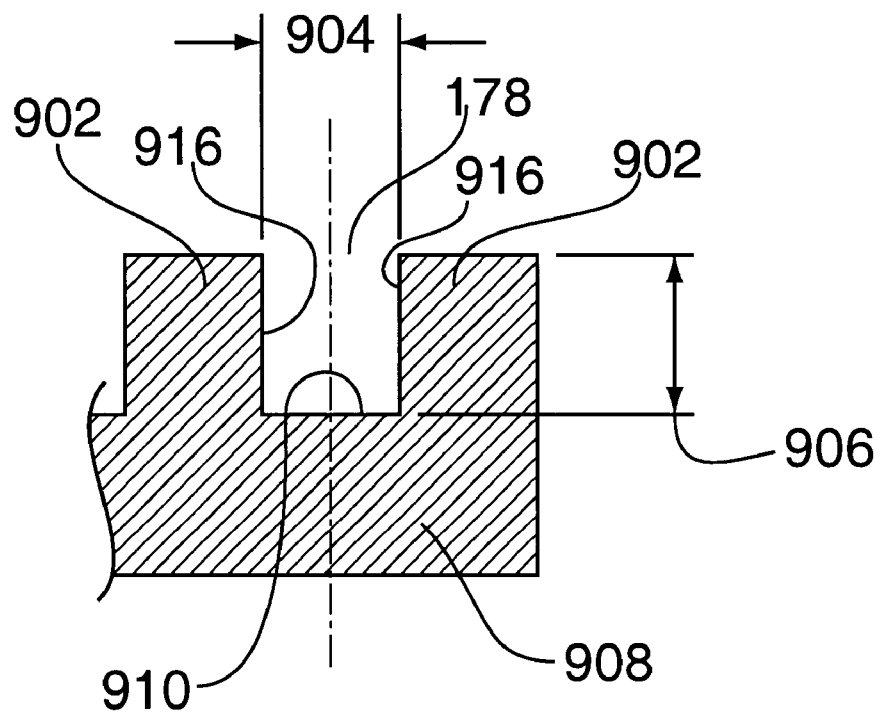
FIG. 9 is a cross-sectional view of the indexable buffer detail of FIG. 8 taken along section line 9—9.

FIGS. 8 and 9 depict the indexable buffer 146. Referring to FIGS. 2, 8 and 9 simultaneously, the indexable buffer 146 has a curved base 908. The base 908 may alternately be configured linearly. The base 908 has a plurality of walls 902, each wall 902 having a height 906 and a width 904. Between the walls 902 are defined a plurality of nests 178. Sides 916 of the nests 178 are substantially parallel and allow for a substrate 120 to be set vertically in the nest 178. The upper surface 910 of the base 908 may be concave or have projections (not shown) that assist in maintaining the substrate 120 moving (or rolling) out of the nest 178. Alternately, a plurality of support members 720 as described with reference to the pass through 150 may be utilized in each nest 178 to retain the wafer 120. Additionally, each nest 178 is optionally equipped with a sensor (not shown) that detects the presence of the substrate.

The indexable buffer 146 is normally positioned in the staging section 140. From this location, both the factory interface robot 158 and the wet robot 104 are able to pick and place substrates 120 on the nests 178 of the indexable buffer 146.

Alternately, the indexable buffer 146 may be moveably positioned in the staging section 140 in a location where one or both robots 104 and 158 cannot access a desired nest 178 on the indexable buffer 146. When the desired nest 178 needs to be accessed by the wet robot 104 or the factory interface robot 158, the indexable buffer 146 moves into a position where both robots 104 and 158 are able to pick and place the substrate 120 on the desired nest 178. For example, the indexable buffer 146 moves, via an indexing means (not shown), the desired nest 178 into a position within the range of motions of both the wet robot 104 and the factory interface robot 158, ensuring that the robots 104 and 158 will be able to place the substrate 120 in the nest 178. If only one robot need access the desired nest 178, the indexable buffer 146 need only move to allow access of the desired nest 178 to that robot.

Referring back to FIGS. 1 and 2, substrates 120 placed secured by one of a plurality of wafer grippers 149 of the walking beam 148 are transported away from the input module 144 through the cleaning system 138 towards an end 154 of the cleaning system 138. The cleaning system 138 comprises a plurality of cleaning system modules (not shown). The walking beam 148 moves the substrates 120 between the cleaning modules where contaminants present on the substrate 120 acquired during polishing are removed, for example, by spraying the substrate 120 with a cleaning fluid 152, scrubbing the substrate 120 and cleaning the substrate 120 megasonically. Preferably, the cleaning system 138 and walking beam 148 is that which is described in U.S. Provisional Application No. 60/131,124, filed Apr. 27, 1999, which is hereby incorporated by reference in it entirety. Once the substrate 120 reaches the end 154 of the walking beam 148, the cleaned substrate 120 is offloaded by the factory interface robot 158 which accesses the walking beam 148 via the first port 160.

The wet robot 104 is fastened by a mounting bracket 214 to the first wall 130 of the cleaning module 106. Please note that the fastening of the wet robot 104 to the cleaning module 106 is not critical. The wet robot 104 may alternately be fastened to the polishing module 102, be free standing, fastened to a motion device (i.e., a railway) or attached elsewhere. Mounting the wet robot 104 to a railway (not shown) will serve to increase the wet robot's 104 range of motion. The wet robot 104 accesses the substrate 120 in the input module 144 via a third port 142 located in the front wall 130. As with the first port 172 and second port 160, the third port 142 may encompass the entire front wall 130. One skilled in the art will appreciate that size and location of the ports 160, 172 and 142 are used to minimize air flow and the passage of contaminants between components and modules. One could easily enlarge the ports, combine the ports, or simply remove the walls and retain the utility of the invention.

Optionally, substrates 120 may be orientated horizontally in the input module 144. In such a configuration, the factory interface robot 158 may not require a rotary actuator. If the cleaning system 138 cleans the substrates horizontally, then the wet robot 104 as well will not require a rotary actuator to orientate the substrate vertically. However, in those cleaning systems 138 that clean the substrate vertically, the wet robot 104 includes a rotary actuator or the system 100 utilizes a separate orientation means (not shown) to orientate the substrate vertically to pass through the cleaning system 138.

The polishing module 102 is illustratively a MIRRA® chemical mechanical polisher manufactured by Applied Materials, Inc., Santa Clara, Calif. Mirra is a registered trademark of Applied Materials, Inc. Other polishing modules 102 may be substituted.

The exemplary polishing module 102 has a plurality of polishing stations 15, a carousel 114, a carousel interface 116 and a transfer station 118. Preferably, the transfer station 118 comprises at least one buffer station, a transfer robot 190, and a wafer load cup assembly 192. Preferably, a plurality of buffer stations is used, e.g., an input buffer station 194 and an output buffer station 196. In operation, the wet robot 104 places a semiconductor wafer into the input buffer station 194. The input buffer station 194 supports the wafer on three pins proximate the edge of the wafer. The transfer robot 190 has two gripper assemblies, each having pneumatic gripper fingers that grab the wafer. The fingers retain the wafer at three points on the edge of the wafer. The robot lifts the wafer from the input buffer station 194 and rotates the gripper and wafer to position the wafer over the wafer load cup assembly 192, then places the wafer down onto the load cup assembly 192. The wafer load cup assembly 192 then loads the wafer into the polishing head 112 at the CMP interface 116. While the transfer robot 190 is positioning the wafer into the wafer load cup assembly 192, the wet robot 104 may be positioning another wafer upon the input buffer station 194. Once a wafer has completed the polishing process, the polishing head 112 releases the wafer into the wafer load cup assembly 192, and the transfer robot 190 removes the wafer from the load cup assembly 192. The polished wafer is then placed in the output buffer station 196 by the transfer robot 190 where it remains until the wet robot 104 removes the polished wafer from the transfer station 118. An example of such a transfer station 118 is described by Tobin in U.S. Pat. No. 6,156,124, issued Dec. 5, 2000, and is hereby incorporated by reference in its entirety.

A chemical mechanical polishing process may be performed at any of the polishing stations 115. The carousel 114 is centrally located within the polishing module 102 and is capable of moving the wafer 120 between the polishing stations 115 and the carousel interface 116. The carousel interface 116 allows for the wafer 120 to be shuttled between the load cup 192 of the transfer station 118 and the polishing heads 112 coupled to the carousel 114.

The wet robot 104 provides wafer transportation between the input module 144 and the transfer station 118 of the polisher 120. The wet robot 104 retrieves the vertical wafer 120 from the input module 144, orientates the wafer 120 horizontally, feature side 122 down, and places the wafer 120 on the transfer station 118 with a backside 124 of the wafer 120 exposed. The process is repeated in reverse to remove wafers 120 from the polishing module 102, In operation, the substrate 120 to be polished is retrieved by the factory interface robot 158 from the desired substrate cassette 110. The factory interface robot 158 "picks" the substrate 120 gripping the edges of the substrate 120. The substrate 120, being stored in the substrate cassette 110 in a horizontal position, is rotated to a vertical position by the factory interface robot 158 using the rotary actuator 204. The substrate 120, now having a vertical orientation, is passed through the second port 172 into the input module 144 of the cleaning module 106.

The point at which the factory interface robot 158 or the wet robot 104 rotates the substrate 120, and the geometry of the first, second and third ports, 172, 160 and 142, respectively, are dependant on the needs of the particular user. For example, the motion of the factory interface robot 158 or the wet robot 104 may be a combination of translational motions (both in the horizontal and vertical planes) and rotational motions performed simultaneously or sequentially. The important aspect of all of the substrate 120 transfers is the ability of the robot to deliver a vertically orientated substrate to the input module 144.

Once the substrate 120 is in the input module 144, the substrate 120 is either placed on the pass through 150 or staged on the indexable buffer 146. If the substrate 120 is to be immediately picked up by the wet robot 104, the substrate 120 is set on the pass through 150 by the factory interface robot 158. After the factory interface robot 158 leaves the input module 144, the substrate 120 is retrieved by the wet robot 104.

If the substrate 120 is to be staged before polishing, the indexable buffer 146 moves from the staging section 140 and positions an empty nest 178 above the pass through 150. The factory interface robot 158 sets the substrate 120 in the nest 178 and the indexable buffer 146 returns to the staging section 140. When the substrate 120 is to be retrieved from the indexable buffer 146, the nest 178 containing the substrate 120 is positioned back over the pass through 150 in the input module 144 to allow the wet robot 104 to retrieve the substrate 120.

The status of each nest 178 (i.e., whether the nest is empty or contains a substrate) of the indexable buffer 146 is maintained by software that controls the loading and off loading of the polishing module 102. The software "keeps track" of the substrates between the polishing module 102 and substrate cassettes 110 in order to optimize the loading sequence. The optional sensors that detect whether substrates are present in the nests 178 provide feedback to the software, confirming whether a particular nest contains the substrate. As such, the robots pick and place substrates within the indexable buffer without placing two substrates in the same nest 178.

The wet robot 104 extracts the substrate 120 from the cleaning module 106 via the third port 142, rotates the substrate 120 to a horizontal position, and places the substrate 120 on the transfer station 118. The substrate 120 is then moved to the CMP robot interface 116 where the substrate 120 is delivered by the CMP robot 114 to an available polishing station 112.

Once polishing is complete, the polished substrate 120 is moved by the CMP robot 114 to the CMP robot interface 116 and back to the transfer station 118. The polished substrate 120 is retrieved by the wet robot 104 and delivered back to the input module 144 via the third port 142.

Once the polished substrate 120 is in the input module 144, the polished substrate 120 is gripped by the walking beam 148. The walking beam 148 transports the substrate 120 from the input module 144 through the cleaning module 106. While the substrate 120 is begin transported through the cleaning module 106, slurry and other contaminants that have accumulated on the substrate 120 during polishing are removed. In the cleaning system 138 of the cleaning module 106, the substrate 120 is generally washed and scrubbed with the cleaning fluid 152 and megasonic energy. Upon reaching the end 154 of the cleaning module 106, the cleaned substrate 120 is removed from the walking beam 148 by the factory interface robot 158 via the first port 160 and transported into the factory module 108.

The factory interface robot 158 returns the cleaned substrate 120 to a horizontal position, and places the cleaned substrate 120 into the desired substrate cassette 110.

The invention provides a method and apparatus for rapidly transferring substrates to and from a substrate polisher using a pass through station having a relatively small footprint. The invention maximizes throughput by permitting one robot to continue to transport substrates between the buffer station while the other robot is unavailable for direct substrate transfer between robots. Thus, using only two robots maximizes substrate throughput of the polishing equipment while minimizing capital costs.

Although the embodiment disclosed above which incorporate the teachings of the present invention has been shown and described in detail herein, those skilled in the art can readily devise other varied embodiments which still incorporate the teachings and do not depart from the spirit of the invention.

What is claimed is:

1. A semiconductor substrate polishing system for polishing a substrate comprising:
    one or more polishing modules having a transfer station;
    an input module;
    a first robot disposed proximate said input module and having a first gripper that is rotatable on a first horizontal axis, said first gripper adapted to selectively picking and placing the substrate vertically in said input module; and
    a second robot disposed proximate said input module and said polishing modules, said second robot having a second gripper that is rotatable on a second horizontal axis, said second gripper adapted to selectively picking and placing the substrate vertically in said input module and horizontally in said transfer station.

2. The polishing system claim 1, wherein said input module further comprises:
    a pass through having a slot adapted to hold the substrate vertically.

3. The polishing system of claim 1, wherein the input module further comprises:
    a plurality of wafer supports disposed in said input module adapted to receive and maintain the substrate in a vertical orientation.

4. The polishing system of claim 3, wherein each of the wafer supports further comprises:
    a first portion and a second portion defining a slot therebetween, wherein the substrate is at least partially disposed in said slot.

5. The polishing system claim 1, wherein said input module further comprises:
    an indexable buffer having a plurality of nests, each of said nests in said plurality of nests adapted to maintain the substrate in a vertical position.

6. The polishing system claim 1, wherein said gripper of said first robot comprises an edge contact gripper.

7. The polishing system claim 6, wherein said edge contact gripper further comprises:
    a paddle;
    a plurality of seats disposed on said paddle.

8. The polishing system of claim 7, wherein the edge contact gripper comprises:
    an actuator having a pusher disposed on said paddle.

9. The polishing system of claim 8, wherein the pusher selectively clamps the substrate against said seats.

10. The polishing system of claim 9, where paddle further comprises:
    a first end on which the pusher is disposed;
    a second end having at least one of said seats; and
    a third end having at least one of said seats.

11. The polishing system claim 1, wherein said gripper of said second robot comprises an edge contact gripper.

12. The polishing system claim 1, wherein said one or more polishing modules comprises a chemical mechanical polisher.

13. The polishing system claim 1 further comprising:
    a railway, said first robot being movably connected to said railway.

14. A semiconductor substrate polishing system for polishing substrates comprising:
    one or more polishing modules;
    a factory interface module having at least one substrate cassette;
    a cleaning module disposed between said factory interface module and said one or more polishing modules;
    an input module disposed in the factory interface or the cleaning module;
    a first robot laterally movable within the factory interface module and having a first gripper, said first robot adapted to transfer substrates between said substrate cassette, said input module and said cleaning module; and a second robot having a second gripper, said second robot adapted to transfer substrates between said input module, said cleaning module and said one or more polishing modules.

15. The polishing system claim 14, wherein said input module further comprises:

a pass through adapted to maintain the substrate in a vertical position.

16. The polishing system claim 14, wherein said input module further comprises:

a plurality of wafer supports disposed in said input module adapted receive and maintain the substrate in a vertical orientation.

17. The polishing system of claim 16, wherein each of the wafer supports further comprises:

a first portion and a second portion defining a slot therebetween, wherein the substrate is at least partially disposed in said slot.

18. The polishing system claim 14, wherein said input module further comprises:

an indexable buffer having a plurality of nests, each of said nests in said plurality of nests adapted to maintain the substrate in a vertical position.

19. The polishing system claim 14, wherein the gripper of the first robot is a vacuum gripper, an electrostatic gripper, an edge contact gripper or a mechanical clamp.

20. The polishing system claim 14, wherein the gripper of the first robot further comprises:

a paddle having a first end, a second end and a third end;

a plurality of seats, at least one of said seats disposed on said first end, said second end and said third end; and an actuator having a pusher disposed on said first end of said paddle, wherein said pusher selectively clamps an edge of the substrate against said seats disposed on said third end and said second end.

21. The polishing system claim 20, wherein the gripper of the second robot further comprises:

a paddle having a first end, a second end and a third end;

a plurality of seats, at least one of said seats disposed on said first end, said second end and said third end; and an actuator having a pusher disposed on said first end of said paddle, wherein said pusher selectively clamps the edge of substrate against said seats disposed on said third end and said second end.

22. The polishing system claim 14, wherein said at least one substrate cassette comprises four substrate cassettes.

23. The polishing system claim 14 further comprising:

a railway disposed within said factory interface module, said first robot being movably connected to said railway.

24. The polishing system claim 14 further comprising:

a railway disposed proximate said polishing module, said second robot being movably connected to said railway.

25. A method for transferring a semiconductor substrate in a substrate polishing system comprising the steps of:

providing a horizontally orientated semiconductor substrate at a first location;

gripping said horizontally orientated semiconductor substrate with a first robot;

moving said semiconductor substrate while changing the orientation of the semiconductor substrate from horizontal to vertical;

releasing said vertical semiconductor substrate from said first robot into an input module, said input module maintaining the vertical orientation of said semiconductor substrate;

gripping said vertical semiconductor substrate with a second robot;

moving said semiconductor substrate while changing the orientation of said semiconductor substrate from vertical to horizontal;

placing said horizontal semiconductor substrate at a second location and releasing said semiconductor substrate from said second robot.

26. The method of claim 25, wherein the step of moving the substrate while changing the orientation of the substrate from horizontal to vertical further comprises:

stopping the movement of the substrate in a horizontal plane while rotating the substrate between the horizontal and the vertical orientation.

27. The method of claim 25, wherein the step of moving the substrate while changing the orientation of the substrate from vertical to horizontal further comprises:

stopping the movement of the substrate in a horizontal plane while rotating the substrate between the vertical and the horizontal orientation.

28. The method of claim 25, wherein the input module is a pass through, a walking beam or a indexing buffer.

29. The method of claim 25, wherein the second location comprises a chemical mechanical polisher.

30. The method of claim 25 further comprising the steps of:

polishing said semiconductor substrate; and cleaning said semiconductor substrate.

31. The method of claim 25, wherein the step of gripping said horizontally orientated semiconductor substrate with the first robot further comprises:

clamping an edge of the substrate.

32. The method of claim 25, wherein the step of gripping said vertically orientated semiconductor substrate with the second robot further comprises:

clamping an edge of the substrate.

33. The polishing system of claim 14, wherein the one or more polishing modules are one or more chemical mechanical polishers.

* * * * *

UNITED STATES PATENT AND TRADEMARK OFFICE
CERTIFICATE OF CORRECTION

PATENT NO.     : 6,361,422 B1
DATED          : March 26, 2002
INVENTOR(S)    : Ettinger et al It is certified that error appears in the above-identified patent and that said Letters Patent is hereby corrected as shown below:

<u>Title page,</u>
Item [57], ABSTRACT,
Line 13, please change "orientated" to -- oriented --.

<u>Column 1,</u>
Line 44, please change "orientated" to -- oriented --.
Line 59, please change "orientated" to -- oriented --.
Line 60, please change "foot-print" to -- footprint --.
Line 62, please change "orientating" to -- orienting --.
Line 66, please change "art for apparatus" to -- art for an apparatus --.

<u>Column 2,</u>
Lines 35 and 36, please change "orientated" to -- oriented --.

<u>Column 3,</u>
Line 8, please change "cross-sectional" to -- cross sectional --.
Line 23, please change "four cassette" to -- four cassettes --.
Line 41, please change "orientated" to -- oriented --.
Line 59, please change "required transfer" to -- required to transfer --.

<u>Column 4,</u>
Line 25, please change "to the edge" to -- of the edge --.
Line 37, please change "orientated" to -- oriented --.
Line 49, please change "orientated" to -- oriented --.

<u>Column 5,</u>
Line 32, please make "is used securely" to -- is used to securely --.
Line 44, please change "orientated" to -- oriented --.

<u>Column 6,</u>
Line 30, please change "alternately" to -- alternatively --.
Line 39, please change "Alternately" to -- Alternatively --.
Line 50, please change "Alternately" to -- Alternatively --.
Line 66, please change "secured" to -- securely --.

UNITED STATES PATENT AND TRADEMARK OFFICE
CERTIFICATE OF CORRECTION

PATENT NO. : 6,361,422 B1
DATED : March 26, 2002
INVENTOR(S) : Ettinger et al

It is certified that error appears in the above-identified patent and that said Letters Patent is hereby corrected as shown below:

Column 7,
Line 13, please change "it entirety" to -- its entirety --.
Line 36, please change "orientated" to -- oriented --.
Line 41, please change "orientate" to -- orient --.
Line 44, please change "orientate" to -- orient --.
Line 53, please change "stations 15" to -- stations 115 --.

Column 8,
Line 28, please change "orientates" to -- orients --.
Line 47, please change "dependant" to -- dependent --.
Line 54, please change "orientated" to -- oriented --.

Column 9,
Line 34, please change "begin" to -- being --.
Lines 57-58, please change "incor-porate the teachings" to -- incor-porates the teachings --.

Column 10,
Line 3, please change "adapted to selectively" to -- adapted to transfer selectively --.
Line 9, please change "adapted to selectively" to -- adapted to transfer selectively --.
Line 26, please change "system claim" to -- system of claim --.
Line 31, please change "system claim" to -- system of claim --.
Line 33, please change "system claim" to -- system of claim --.
Line 47, please change "system claim" to -- system of claim --.
Line 49, please change "system claim" to -- system of claim --.
Line 52, please change "system claim" to -- system of claim --.

Column 11,
Line 8, please change "system claim" to -- system of claim --.
Line 12, please change "system claim" to -- system of claim --.
Line 15, please change "adapted receive" to -- adapted to receive --.
Line 22, please change "system claim" to -- system of claim --.
Line 28, please change "system claim" to -- system of claim --.
Line 31, please change "system claim" to -- system of claim --.
Line 40, please change "system claim" to -- system of claim --.
Line 50, please change "system claim" to -- system of claim --.
Line 52, please change "system claim" to -- system of claim --.
Line 56, please change "system claim" to -- system of claim --.

UNITED STATES PATENT AND TRADEMARK OFFICE
CERTIFICATE OF CORRECTION

PATENT NO.    : 6,361,422 B1
DATED         : March 26, 2002
INVENTOR(S)   : Ettinger et al It is certified that error appears in the above-identified patent and that said Letters Patent is hereby corrected as shown below:

Column 12,
Line 3, please change "orientated" to -- oriented --.
Line 5, please change "orientated" to -- oriented --.
Line 39, please change "beam or a indexing" to -- beam or an indexing --.
Line 47, please change "orientated" to -- oriented --.
Line 51, please change "orientated" to -- oriented --.

Signed and Sealed this

Second Day of July, 2002

Attest:

JAMES E. ROGAN
Attesting Officer    Director of the United States Patent and Trademark Office